United States Patent [19]

Shishido

[11] Patent Number: 5,777,375

[45] Date of Patent: Jul. 7, 1998

[54] SEMICONDUCTOR DEVICE IMPROVED IN A STRUCTURE OF AN L-PNP TRANSISTOR

[75] Inventor: Norihiko Shishido, Yokohama, Japan

[73] Assignee: Kabushiki Kaisha Toshiba, Kawasaki, Japan

[21] Appl. No.: 745,368

[22] Filed: Nov. 8, 1996

Related U.S. Application Data

[63] Continuation of Ser. No. 385,432, Feb. 8, 1995, abandoned.

[30] Foreign Application Priority Data

Feb. 21, 1994 [JP] Japan .................................. 6-022487

[51] Int. Cl.$^6$ .................................................. H01L 29/00
[52] U.S. Cl. ...................... 257/550; 257/554; 257/556; 257/558
[58] Field of Search ........................ 257/141, 162, 257/343, 512, 518, 552, 554, 555, 556, 557, 575, 588, 591, 558, 550

[56] References Cited

U.S. PATENT DOCUMENTS 5,163,178 11/1992 Gomi et al. ............................ 257/554

FOREIGN PATENT DOCUMENTS 3-73539 3/1991 Japan.

*Primary Examiner*—Minh-Loan Tran
*Attorney, Agent, or Firm*—Finnegan, Henderson, Farabow, Garrett & Dunner, L.L.P.

[57] ABSTRACT

A semiconductor device relating to an improvement in an L-PNP transistor in particular is such that, on a semiconductor substrate of a first conductivity type, a base region is formed which has a second conductivity type opposite in conductivity to the first conductivity type. A first conductivity type impurity ion is implanted into the base region to provide at least two first diffusion layers there. The first diffusion layers have a first impurity concentration level and are formed as collector and emitter regions. A polysilicon layer is formed on the first diffusion layer in base region in an overhanging relation to the first diffusion layer and contains the first conductivity type impurity. A second diffusion layer is formed around the collector region and around the emitter region by diffusing an impurity from the polysilicon layer. The collector and emitter regions each are formed as a two-layered structure with their first and second diffusion layers. The second diffusion layer has a second impurity concentration level lower that of the first diffusion layer.

2 Claims, 5 Drawing Sheets

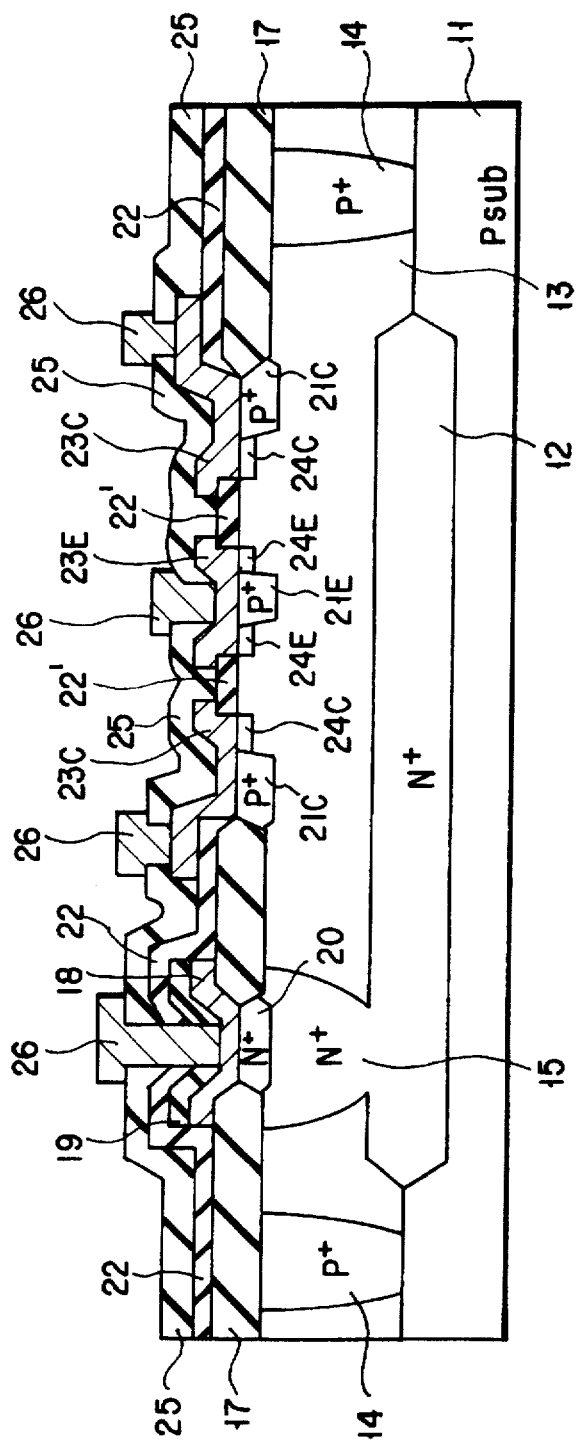
F I G. 10
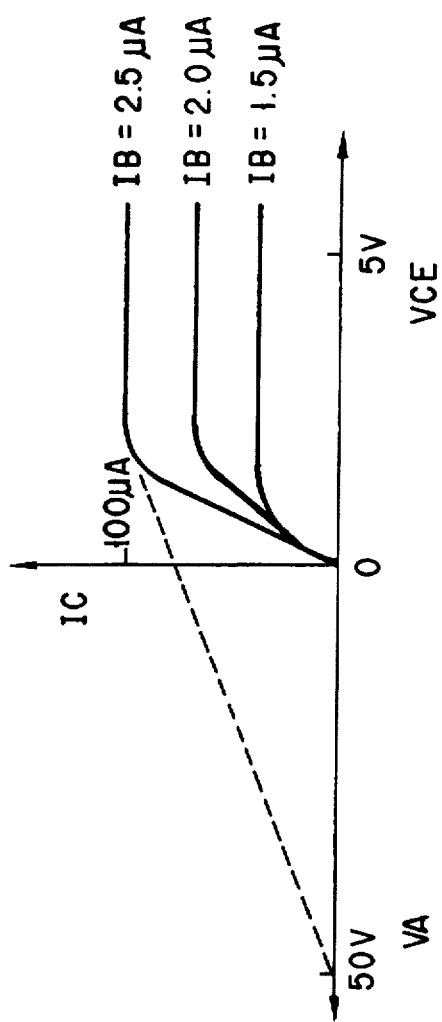
F I G. 11

5,777,375

SEMICONDUCTOR DEVICE IMPROVED IN A STRUCTURE OF AN L-PNP TRANSISTOR

This application is a continuation of application Ser. No. 08/385,432, filed Feb. 8, 1995, now abandoned.

BACKGROUND OF THE INVENTION

1. Field of the Invention

The present invention relates to a semiconductor device, and method for manufacturing the same, directed in particular to an improvement in a lateral PNP transistor.

2. Description of the Related Art

A lateral PNP transistor (hereinafter referred to as an L-PNP) is used for a composite device, such as an IIL (integrated injection logic). The known L-PNP will be explained below with reference to FIGS. 1 to 3.

In FIG. 1, L-PNP comprises an N⁺ buried layer 102 provided on a P type semiconductor substrate 101, an N epitaxial layer 103 provided on the substrate 101, an N⁺ region 105 selectively provided in the N epitaxial layer 103 and serving as a base electrode connection layer and P⁺ type collector and emitter regions 106 and 107 formed in the N epitaxial layer 103 by an ion implantation method in a way to separate from each other.

As shown in FIG. 2, another L-PNP has a P type polysilicon layer 108 selectively formed over an N epitaxial layer 103, and collector and emitter regions 109 and 110 are formed through the diffusion of a P type impurity from a P type polysilicon layer 108 into the N epitaxial layer 103.

Thus the collector and emitter regions are formed by the ion implantation method or through the diffusion of the impurity from the polysilicon layer. Even if the collector and emitter regions are formed using either of these methods, it is seen from the graph of FIG. 3 that, with a rise in $V_{CE}$, the L-PNP transistor has its effective base width (a base portion not containing a depletion layer at all) varied due to the extending of a depletion layer of a collector-base junction so that there occurs an abrupt increase in collector current. In the above-mentioned conventional L-PNP structure, there arises a problem with a lowering in early voltage.

Jpn. Pat. Appln. KOKAI Publication No.3-73539 shows the prior art technique for enhancing early voltage. According to the method for manufacturing a lateral type bipolar transistor, in order to form collector and emitter regions, a thin film pattern is formed and a side-wall-like insulating film is left at the pattern's side surface and a low concentration impurity region is provided by the ion implantation method outside a high concentration impurity region.

In the technique above, a so-called channeling effect is produced when the ion implantation is effected. Further, the crystallinity of the low concentration impurity region ceases to be pure, there being a risk that operation will fail in a low current region. It is also indicated that the current amplification factor cannot be enhanced since the base width cannot be narrowed.

SUMMARY OF THE INVENTION

It is accordingly the object of the present invention to provide a semiconductor device and method for manufacturing the same, which, in an L-PNP transistor in particular, can obtain a high early voltage, can operate in a low current region without involving any channeling effect and can enhance a current amplification factor.

In order to achieve the object of the present invention, there is provided a semiconductor device relating to an improvement in an L-PNP transistor in particular, comprising:

a semiconductor substrate of a first conductivity type;

a base region of a second conductivity type opposite in conductivity to the first conductivity type;

at least two first diffusion layers formed by implanting an impurity ion of the first conductivity type into the base region, the at least two first diffusion layers having a first impurity concentration level and providing collector and emitter regions;

a polysilicon layer formed on the first diffusion layers in base region in an overhanging way and having an impurity of the first conductivity type; and a second diffusion layer of the second impurity concentration level provided around the collector region and around the emitter region by diffusing the impurity from the polysilicon layer, the second diffusion layer, together with the first diffusion layer, providing a two-layered structure.

Further, a method for manufacturing a semiconductor device relating to an improvement in a lateral type PNP transistor, comprising to steps of:

forming, on a semiconductor substrate of a first conductivity type, a base region which has a second conductivity type opposite in conductivity to the first conductivity type;

forming at least two first diffusion layers formed by implanting an impurity ion of the first conductivity type into the base region, the two first impurity layers providing collector and emitter regions;

forming a polysilicon layer on the first diffusion layers and base region in an overhanging relation to the first diffusion layer, the polysilicon layer having an impurity of the first conductivity type; and forming a second diffusion layer around the collector region and around the emitter region by diffusing the impurity from the polysilicon layer, the collector and emitter regions each providing a two-layered structure with their first and second diffusion layers.

By the above-mentioned arrangement, the semiconductor device of the present invention relating to an improvement in an L-PNP in particular can suppress a depletion layer from extending in a collector-base junction so that it stays fixed, can eliminate a variation in an effective base width, can obtain a high early voltage and can prevent any channel effect from being produced. The present device operates in a narrow current region, can narrow the base width and can enhance a current amplification factor.

Further, according to the present manufacturing method of a semiconductor device relating to an improvement in an L-PNP transistor in particular, when the second diffusion layer is formed around the first diffusion layer by diffusing an impurity from the polysilicon layer into the base region, the extending of a depletion layer at the collector-base junction is suppressed at the end of the polysilicon layer and kept to a given extent. It is, therefore, possible to eliminate a variation in the effective base width and to obtain a high early voltage. It is also possible for a device to produce no channel effect and to operate even in a low current region. The current amplification factor can be enhanced due to the narrowed base width.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a cross-sectional view showing another manufacturing process subsequent to the process of FIG. 9; and FIG. 11 is a graph showing the static characteristic of the L-PNP transistor of the present invention.

DETAILED DESCRIPTION OF THE PREFERRED EMBODIMENTS

One embodiment of the present invention will be explained below with reference to the accompanying drawings.

Figure 1:
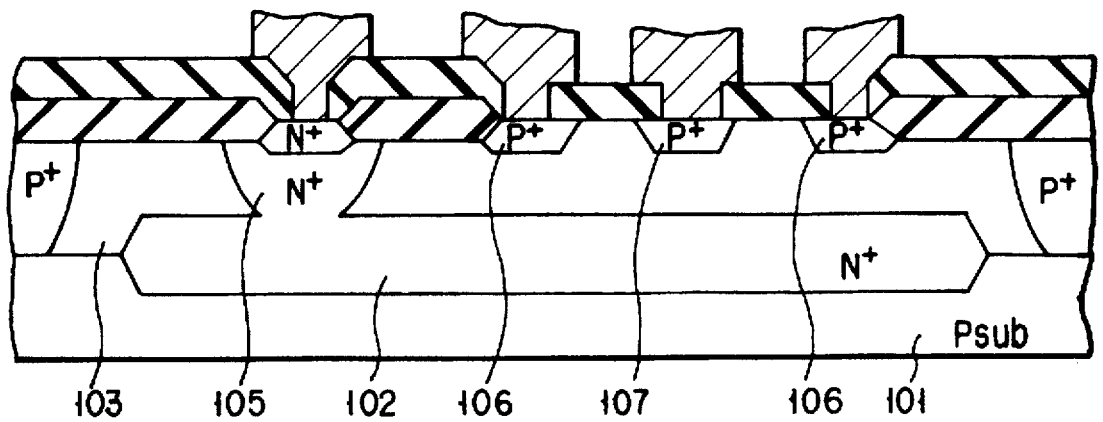
FIG. 1 is a cross-sectional view showing a major section of one form of a conventional L-PNP transistor.
Figure 2:
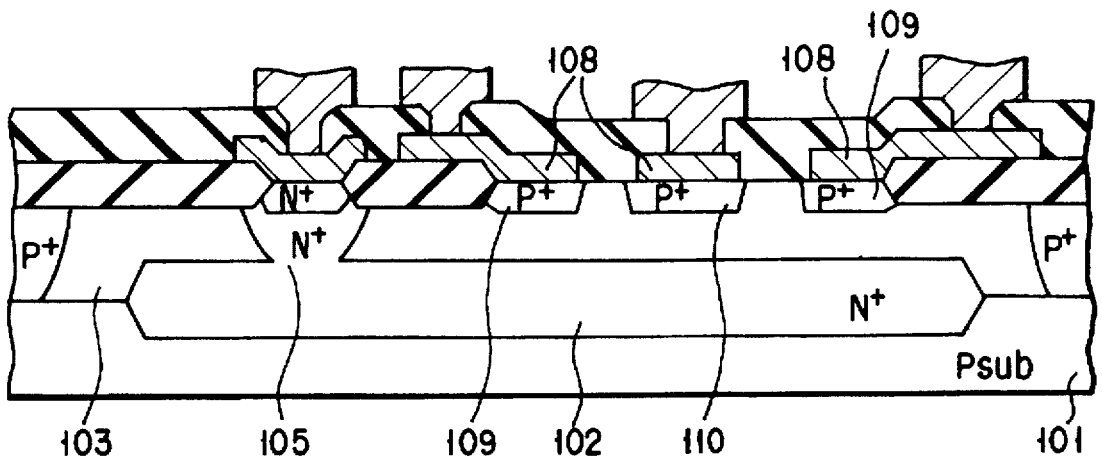
FIG. 2 is a cross-sectional view showing a major section of another form of a conventional L-PNP transistor.
Figure 3:
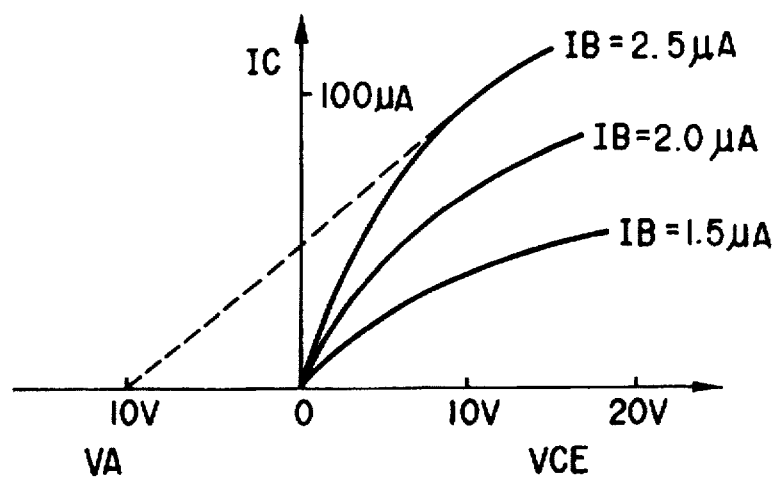
FIG. 3 is a graph showing the static characteristic of the L-PNP transistor in FIGS. 1 and 2.
Figure 4:
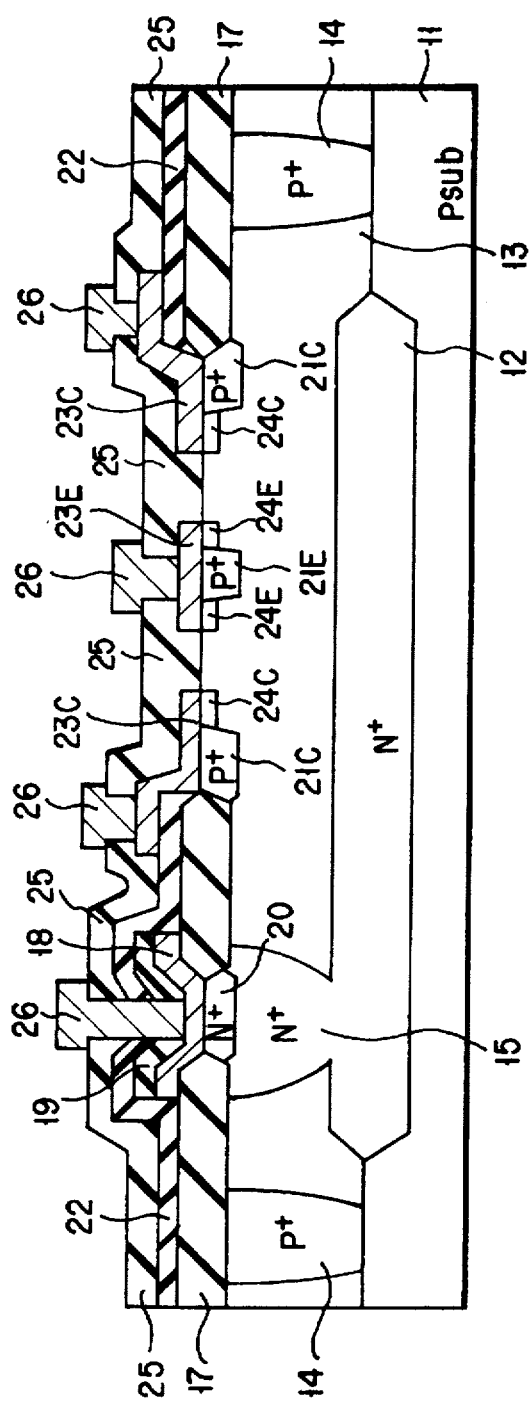
FIG. 4 is a cross-sectional view showing a major section of an arrangement of a semiconductor device according to one embodiment of the present invention as applied to an L-PNP transistor.

In a semiconductor device according to an L-PNP transistor of the present invention, an $N^+$ buried layer 12 is provided at a P type semiconductor substrate 11 as shown in FIG. 4. An N epitaxial layer serving as a base region 13 is provided on the P type semiconductor substrate 11. A $P^+$ isolation region 14 and $N^+$ connection region 15 are provided in the N epitaxial layer 13, the $N^+$ connection region 15 selectively formed in the N epitaxial layer 13 and serving as a base electrode connection area. An oxide film 17 is selectively provided on the surface of the N epitaxial layer 13.

An N type polysilicon layer 18 is provided on the $N^+$ region 20 and a portion of an oxide film 17, the $N^+$ region 20 being formed by a diffusion via the $N^+$ connection region 15.

An insulating film 19 is provided on an N type polysilicon layer 18.

A $P^+$ region 21C and $P^+$ region 21E are formed in the N epitaxial layer 13 by the ion implantation step and serve as a collector region and emitter region, respectively.

P type polysilicon layers 23C and 23E are provided on the $P^+$ region 21C and $P^+$ region 21E, respectively, in an overhanging way.

Through impurity diffusion from the P type polysilicon layers 23C and 23E, P regions 24C and 24E are formed around the $P^+$ regions 21C and 21E in the N epitaxial layer 13 and serve as collector region and emitter region, respectively. The collector region constitutes a double diffusion layer structure of the $P^+$ region 21C and P region 24C and the emitter region constitutes a double diffusion layer structure of the $P^+$ region 21E and P region 24E. In the N epitaxial layer 13, the $P^+$ region 21C is formed as being deeper and higher in concentration and P region 24C is formed as being shallower and lower in concentration than the $P^+$ region 21C. Similarly, the $P^+$ region 21E is formed, in the N epitaxial layer 13, as being deeper and higher in concentration and the P region 24E is formed as being shallower and lower in concentration than the $P^+$ region 21E.

An insulating film 25 is provided on the N epitaxial layer, P type polysilicon layers 23C, 23E, and insulating film 22 partially formed on the oxide film 17.

An A1 connection layer 26 is connected to the N type polysilicon layer 18 via an opening formed in the insulating film 25, insulating film 22 and insulating film 19.

Other A1 connection layers 26 are connected to the P type polysilicon layers 23C, 23E via an opening in the insulating film 25.

A manufacturing method of the semiconductor device will be explained below with reference to FIGS. 5 to 7.

Figure 5:
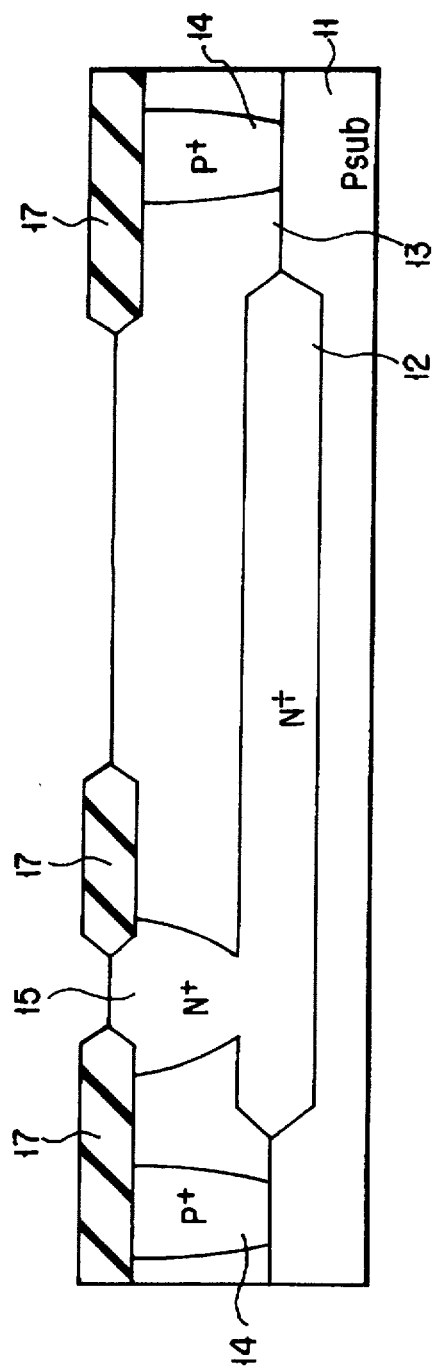
FIG. 5 is a cross-sectional view showing one manufacturing process for explaining a method for manufacturing an L-PNP transistor in FIG. 4.

In the manufacturing step shown in FIG. 5, antimony is selectively diffused into a P type semiconductor substrate (boron concentration: $1.0 \times 10^{13}$ $cm^{-3}$)11 to provide an $N^+$ buried layer (antimony concentration: $1.0 \times 10^{20}$ $cm^{-3}$)12. An epitaxial layer (phosphorus concentration: $1.0 \times 10^{15-16}$ $cm^{-3}$)13 is formed on the P type semiconductor substrate 11 and $N^+$ buried layer 12. Boron is diffused into the N epitaxial layer 13 to provide a $P^+$ isolation region (boron concentration: $1.0 \times 10^{20}$ $cm^{-3}$)14. An $N^+$ connection region 15 is selectively formed in the N epitaxial layer 13, the region 15 serving as a base electrode connection area. Then an oxide film 17 is selectively formed on a resultant surface.

Figure 6:
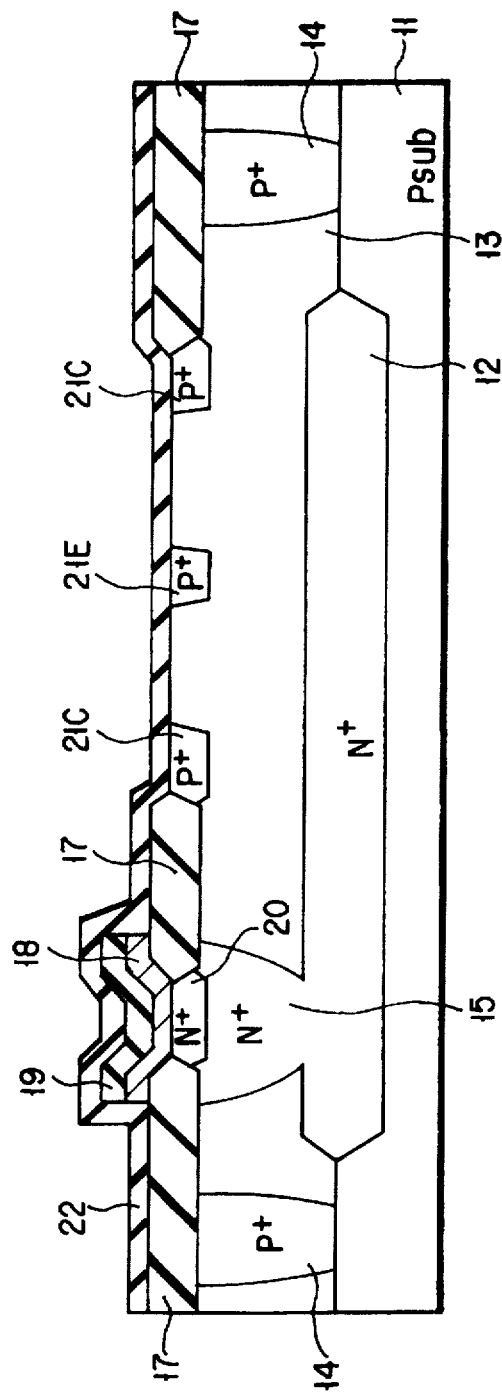
FIG. 6 is a cross-sectional view showing another manufacturing process subsequent to the manufacturing process of FIG. 5.

As shown in FIG. 6, polysilicon is deposited as a 2500 Å-thick layer on the resultant structure and an arsenic ion is implanted into the polysilicon layer to provide an N type polysilicon layer (concentration: $1.0 \times 10^{21}$ $cm^{-3}$)18 on which an insulating film 19 is formed. The N type polysilicon layer 18 and insulating film 19 are etched away except over the $N^+$ connection area 15.

A $BF_2$ ion is selectively implanted into the N epitaxial layer 13 to provide $P^+$ regions (concentration: $1.0 \times 10^{20}$ $cm^{-3}$) 21C and 21E serving as a collector region and emitter region. After an insulating film 22 has been formed on a resultant surface, the resultant structure is subjected to heat treatment.

Figure 7:
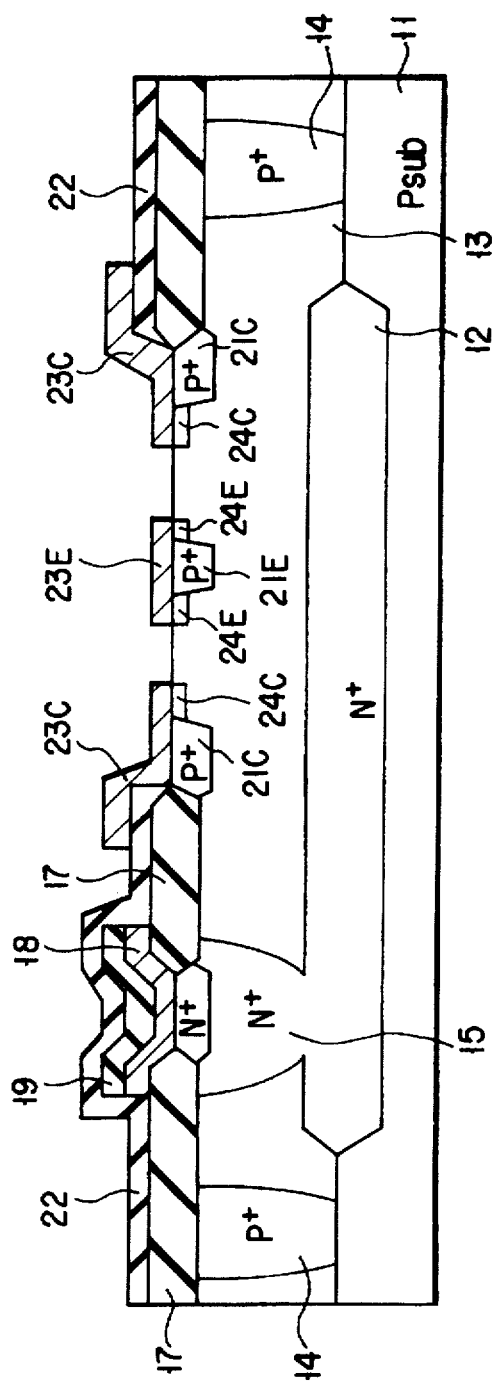
FIG. 7 is a cross-sectional view showing another manufacturing process subsequent to the manufacturing process of FIG. 6.

As shown in FIG. 7, the insulating film 22 on the N epitaxial layer 13 is etched away. A polysilicon is deposited on the resultant surface to a thickness of 1500 Å. A boron ion is implanted into the resultant polysilicon layer to provide a P type polysilicon layer (concentration: $1.0 \times 10^{18}$ $cm^{-3}$).

The P type polysilicon layer is patterned to provide P type polysilicon layers 23C and 23E on $P^+$ regions 21C and 21E, respectively. At that time, the P type polysilicon layers 23C and 23E are so formed as to cover the $P^+$ regions 21C and 21E in an overhanging way.

Thereafter, the resultant structure is heat treated to allow a P type impurity to be diffused from the P type polysilicon layers 23C and 23E into the N epitaxial layer 13 so that P regions 24C and 24E serving as collector and emitter areas 24C and 24E are provided.

The P regions 24C and 24E are provided through the shallow diffusion of the impurity around the $P^+$ regions 21C and 21E.

Then, an insulating film 25 is formed on the whole surface of the resultant semiconductor structure as shown in FIG. 4.

By the selective etching of the insulating film 25 an opening is provided over the N type polysilicon layer 18 and P type polysilicon layers 23C and 23E, followed by the formation of an Al connection layer 26.

According to the method above, it is possible to readily form collector and emitter regions each comprised of two diffusion layers having different concentration levels.

Since the base width is defined by a self-aligned structure of the P type polysilicon layers 23C and 23E, it is possible to form an L-PNP transistor having better relative accuracy.

Another embodiment of the present invention will be explained below with reference to FIGS. 8 to 10. In this embodiment, the same reference numerals are employed to designate parts corresponding to those shown in FIGS. 8 to 10 and any further explanation is omitted for brevity.

Figure 8:
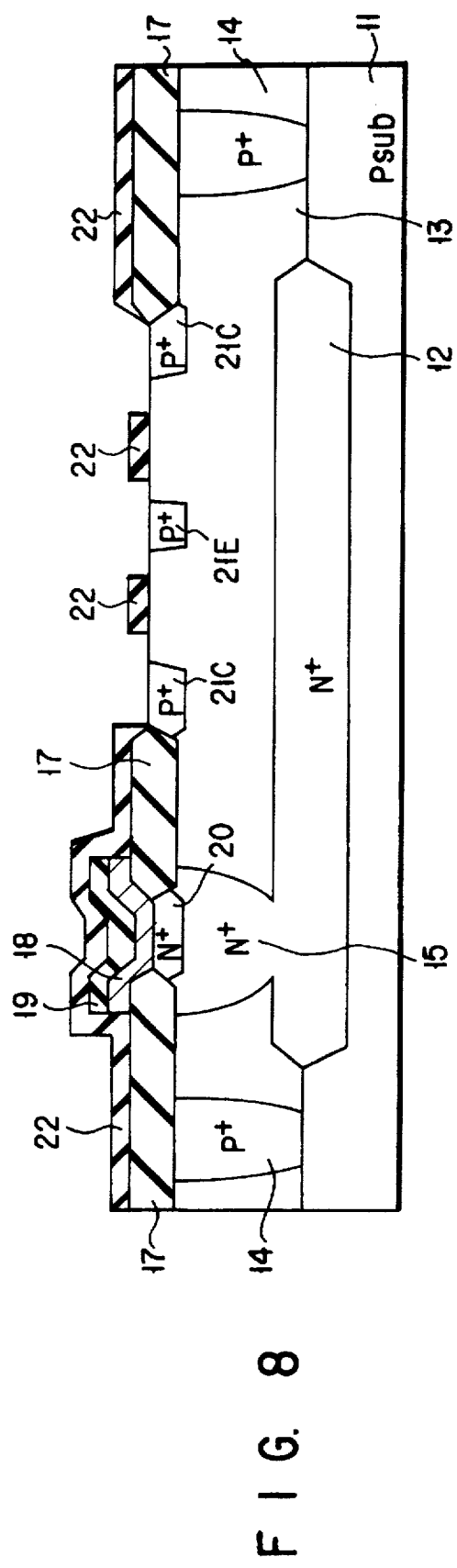
FIG. 8 is a cross-sectional view showing a major section of an arrangement of a semiconductor device according to another embodiment of the present invention as applied to an L-PNP transistor.

As shown in FIG. 8, after P$^+$ regions 21C and 21E have been selectively formed in an N epitaxial layer 13 over a semiconductor substrate 11, an insulating film 22 is formed on a whole surface.

Of the insulating film 22 on the N epitaxial layer 13, those corresponding to collector and emitter formation regions are removed by etching.

Then P type polysilicon layers 23C, 23E are formed on P$^+$ regions 21C and 21E, respectively. At that time, the P type polysilicon layers 23C and 23E cover the P$^+$ regions 21C and 21E, respectively, in an overhanging way.

Figure 9:
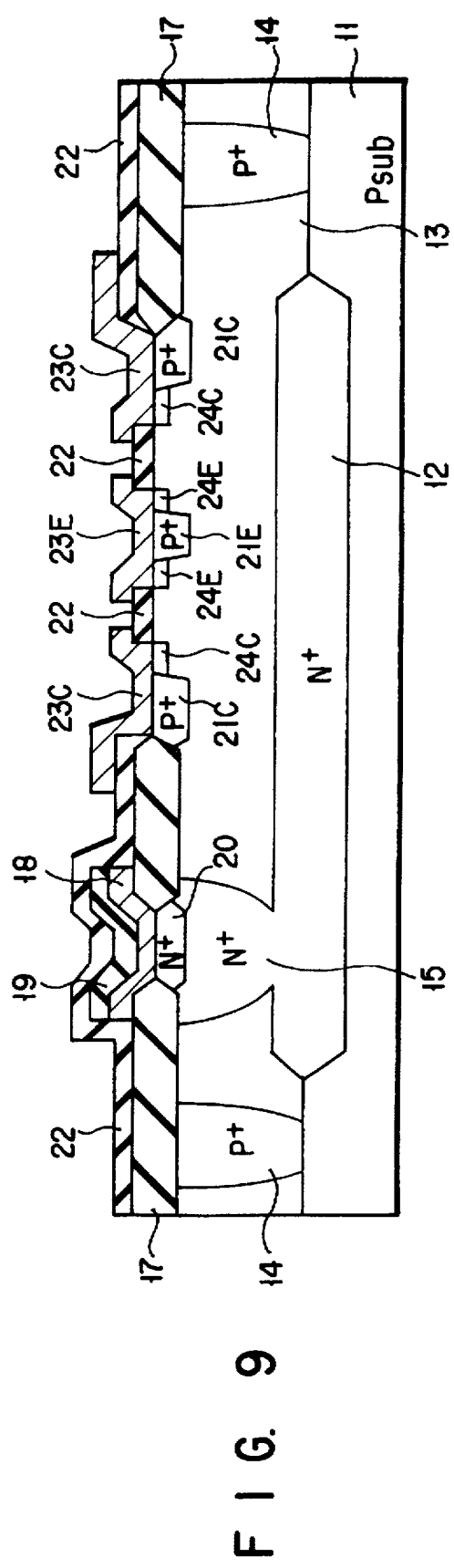
FIG. 9 is a cross-sectional view showing one manufacturing process of manufacturing the semiconductor device of FIG. 8.

Thereafter, the resultant structure is heat treated to allow a P type impurity to be diffused from the P type polysilicon layers 23C and 23E into the N epitaxial layer 13 so that P regions 24C and 24E serving as collector and emitter regions are formed as shown in FIG. 9.

Then an insulating film 25 is formed on the whole surface as shown in FIG. 10.

The semiconductor film 25 is selectively etched and an opening is formed over an N type polysilicon layer 18 and P type polysilicon layers 23C and 23E, followed by the formation of an Al connection layer on the resultant surface.

Even in this embodiment, the collector region and emitter region are each comprised of two diffusion layers, that is, P$^+$ region 21 and P region, as in the case of the previous embodiment. The base width is defined by an insulating film 22.

The characteristic of the L-PNP of an arrangement as shown in FIGS. 4 and 10 will be explained below.

In a graph shown in FIG. 11, even if a collector voltage $V_{CE}$ is raised, the collector current stays at a given level and early voltage $V_A$ can be enhanced to about 50 V.

In the L-PNP of the present invention, the collector region and emitter region have such a configuration as to have high concentration P$^+$ regions 21C and 21E, as major regions and low concentration P regions 24C and 24E, respectively. Even if $V_{CE}$ is increased, a depletion layer in a collector base junction is held to the end of the P type polysilicon layer 23, thereby preventing a variation in the width of the base.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A semiconductor device of improved L-PNP transistor structure, comprising:

a semiconductor substrate of a first conductivity type;

a base region of a second conductivity type which is opposite the first conductivity type;

the base region having at least two first diffusion layers having impurity ions of the first conductivity type, said at least two first diffusion layers having a first impurity concentration level and providing collector and emitter regions;

polysilicon layers respectively formed on and having respective portions overhanging the first diffusion layers in the base region and having impurity ions of the first conductivity type; and respective second diffusion layers, underlying the respective overhang portions of said polysilicon layers, having impurity ions of the first conductivity type diffused therein from said overhang portions of said polysilicon layers, having a second impurity concentration level, and being provided around the collector region and around the emitter region, each of said second diffusion layers, and an associated first diffusion layer providing an adjacent parallel structure, and an effective base width between an end of the second diffusion layer constituting the collector region and an opposing end of the second diffusion layer constituting the emitter region being fixed in relation to a distance between opposing ends of the polysilicon layers.

2. A semiconductor device improved in a structure of an L-PNP transistor according to claim 1, wherein the second impurity concentration level of the second diffusion layer is than the first impurity concentration level of the first diffusion layer.

* * * * *

UNITED STATES PATENT AND TRADEMARK OFFICE
CERTIFICATE OF CORRECTION

PATENT NO. : 5,777,375
DATED : July 7, 1998
INVENTOR(S) : Norihiko SHISHIDO

It is certified that error appears in the above-indentified patent and that said Letters Patent is hereby corrected as shown below:

Title Page, Item [57], in the Abstract,
line 10, "in base" should read --and base--; and
line 18, after "lower", insert --than--.

Claim 2, Col. 6, line 48, before "than", insert --lower--.

Signed and Sealed this

Fifteenth Day of June, 1999

Q. TODD DICKINSON

Attest:

Attesting Officer

Acting Commissioner of Patents and Trademarks